United States Patent
Chao et al.

(10) Patent No.: US 11,264,995 B1
(45) Date of Patent: Mar. 1, 2022

(54) SYSTEM AND METHOD FOR MAINTAINING LOCAL OSCILLATOR (LO) PHASE CONTINUITY

(71) Applicant: QUALCOMM INCORPORATED, San Diego, CA (US)

(72) Inventors: Yue Chao, San Diego, CA (US); Yiwu Tang, San Diego, CA (US); Yunliang Zhu, San Diego, CA (US); Dongmin Park, San Diego, CA (US); Jingcheng Zhuang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/079,795

(22) Filed: Oct. 26, 2020

(51) Int. Cl.
*H03B 19/00* (2006.01)
*H03L 7/197* (2006.01)
*H03L 7/099* (2006.01)
*H03K 5/00* (2006.01)

(52) U.S. Cl.
CPC .......... *H03L 7/099* (2013.01); *H03B 19/00* (2013.01); *H03K 5/00006* (2013.01); *H03L 7/1976* (2013.01)

(58) Field of Classification Search
CPC .... H03B 19/00; H03K 5/00006; H03L 7/099; H03L 7/16; H03L 7/18; H03L 7/183; H03L 7/191; H03L 7/193; H03L 7/197; H03L 7/1974; H03L 7/1976; H04B 1/04; H04B 1/16; H04B 1/40
See application file for complete search history.

(56) References Cited

U.S. PATENT DOCUMENTS

| | | | |
|---|---|---|---|
| 6,822,519 B1 * | 11/2004 | Moreland | H03J 1/005 331/1 A |
| 8,537,956 B1 * | 9/2013 | Pham | H04J 3/047 375/376 |
| 8,744,380 B2 * | 6/2014 | Wenink | H03B 19/00 455/118 |
| 9,276,622 B2 | 3/2016 | Liu et al. | |
| 10,291,242 B1 * | 5/2019 | Elbadry | H03L 7/085 |
| 2005/0127961 A1 * | 6/2005 | Ngo | H03L 7/18 327/156 |
| 2007/0060070 A1 * | 3/2007 | Rafi | H04B 1/40 455/76 |

(Continued)

*Primary Examiner* — Levi Gannon
(74) *Attorney, Agent, or Firm* — Smith Tempel Blaha LLC

(57) ABSTRACT

A local oscillator (LO) circuit includes a voltage controlled oscillator (VCO) configured to receive an output of a phase locked loop (PLL) circuit, the VCO coupled to a clock gating circuit configured to generate a VCO output signal (vco_g), a local oscillator (LO) divider configured to receive the VCO output signal (vco_g) and a local oscillator (LO) preset signal, the LO preset signal configured to set the LO divider to a predetermined initial phase, a programmable divider configured to receive a divider signal and the VCO output signal (vco_g) and generate a local oscillator (LO) phase detection trigger signal, Fv, a toggling accumulator coupled to an output of the programmable divider, the toggling accumulator configured to receive the divider signal and the LO phase detection trigger signal, Fv, and generate a counter signal, and a decision logic configured to receive a sample enable signal and the counter signal and adjust the programmable divider based on the sample enable signal and the counter signal.

25 Claims, 11 Drawing Sheets

(56) References Cited

U.S. PATENT DOCUMENTS

| | | | | |
|---|---|---|---|---|
| 2008/0056427 | A1* | 3/2008 | Bristow | H03L 7/18 |
| | | | | 375/376 |
| 2009/0219099 | A1* | 9/2009 | Dubash | H03L 7/1974 |
| | | | | 331/16 |
| 2010/0039153 | A1* | 2/2010 | Qiao | H03L 7/183 |
| | | | | 327/254 |
| 2011/0200161 | A1* | 8/2011 | Tasic | H03K 21/08 |
| | | | | 377/48 |
| 2012/0262239 | A1* | 10/2012 | Taghivand | H03B 19/14 |
| | | | | 331/16 |
| 2016/0164558 | A1* | 6/2016 | Elzeftawi | H04B 1/0483 |
| | | | | 455/192.1 |
| 2017/0338940 | A1* | 11/2017 | Zanuso | H04L 5/14 |

* cited by examiner

SYSTEM AND METHOD FOR MAINTAINING LOCAL OSCILLATOR (LO) PHASE CONTINUITY

FIELD

The present disclosure relates generally to electronics, and more specifically to radio frequency (RF) transmitters and receivers.

BACKGROUND

Wireless communication devices and technologies are becoming ever more prevalent. Wireless communication devices generally transmit and receive communication signals. A communication signal is typically processed by a variety of different components and circuits. One of the circuits which may be involved in the processing of a communication signal is a phase locked loop (PLL). A PLL is a device that compares the phase and/or frequency of two different signals and generates an error signal that represents the phase and/or frequency difference between the two compared signals. When the two signals have different phase and/or frequencies, the phase and/or frequency difference between the two signals is constantly varying. The error signal is then used to control the phase and/or frequency of the loop, such that when the phase and/or frequency difference between the two signals is fixed, the two signals are at the same phase and/or frequency. A PLL typically includes a phase and/or frequency comparator or detector, a voltage controlled oscillator (VCO) that can adjust the frequency of the PLL based on a control voltage signal, a filter circuit, a feedback circuit, and may include other circuits, such as a buffer circuit, etc.

In a particular use example, the output of the PLL circuit is used to develop what is referred to as a local oscillator (LO) signal. The LO signal is a frequency reference signal and may be used by the transmitter and/or the receiver in the wireless communication device to process transmitted and received radio frequency (RF) signals. There are a number of use examples in which the circuitry that forms the PLL and the LO generator may be placed into a sleep mode or other inactive or low activity state in order to reduce power consumption. When awakening from sleep mode or an inactive state, it is desirable for the PLL and LO generator to quickly begin generating an accurate LO signal.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a circuit including a local oscillator (LO) circuit including a voltage controlled oscillator (VCO) configured to receive an output of a phase locked loop (PLL) circuit, the VCO coupled to a clock gating circuit configured to generate a VCO output signal (vco_g), a local oscillator (LO) divider configured to receive the VCO output signal (vco_g) and a local oscillator (LO) preset signal, the LO preset signal configured to set the LO divider to a predetermined initial phase, a programmable divider configured to receive a divider signal and the VCO output signal (vco_g) and generate a local oscillator (LO) phase detection trigger signal, Fv, a toggling accumulator coupled to an output of the programmable divider, the toggling accumulator configured to receive the divider signal and the LO phase detection trigger signal, Fv, and generate a counter signal, and a decision logic configured to receive a sample enable signal and the counter signal and adjust the programmable divider based on the sample enable signal and the counter signal.

Another aspect of the disclosure provides a method for maintaining phase continuity of a local oscillator (LO) including setting a predetermined initial phase of a local oscillator (LO) divider, generating a voltage controlled oscillator (VCO) signal (vco_g), determining whether the VCO signal (vco_g) is aligned with a continuous phase signal, and when the VCO signal (vco_g) is not aligned with the continuous phase signal, aligning the VCO signal (vco_g) with the continuous phase signal.

Another aspect of the disclosure provides a device including means for setting a predetermined initial phase of a local oscillator (LO) divider, means for generating a voltage controlled oscillator (VCO) signal (vco_g), means for determining whether the VCO signal (vco_g) is aligned with a continuous phase signal, and means for aligning the VCO signal (vco_g) with the continuous phase signal when the VCO signal (vco_g) is not aligned with the continuous phase signal.

Another aspect of the disclosure provides a local oscillator (LO) circuit including a voltage controlled oscillator (VCO) and a clock gating circuit configured to generate a VCO output signal (vco_g), a local oscillator (LO) divider configured to receive the VCO output signal (vco_g) and a local oscillator (LO) preset signal, the LO preset signal configured to set the LO divider to a predetermined initial phase, a programmable divider configured to receive a divider signal and the VCO output signal (vco_g) and generate a phase detection signal, the programmable divider disposed in a feedback path of a phase locked loop (PLL) circuit, and an adjustment circuit configured to adjust a phase of the VCO output signal (vco_g).

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In a modern wireless communication device, there are a number of operating conditions and circuit architecture considerations that make it important to be able to maintain local oscillator phase continuity (LOPC). For example, the PLL and LO circuitry in a wireless communication device may be shut down when the wireless communication device enters a sleep state, a micro-sleep state, or any other inactive or low activity state. Other considerations that make maintaining LOPC difficult include, for example, the use of a single PLL circuit for both transmit and receive, a transmit architecture that uses an uplink-multiple input multiple output (UL-MIMO) antenna arrangement, or a 5G transmit/receive (TRx) architecture where one intermediate frequency (IF) chip may support multiple radio frequency (RF) chips. In these scenarios, it is desirable to have the ability to maintain local oscillator phase continuity when switching on and off the PLL and LO divider circuitry.

For example, ambiguity in the phase of the LO divider when an enable signal may appear, and/or uncertainty of start-up timing may make it a challenge to maintain local oscillator phase continuity.

Exemplary embodiments of the disclosure are directed to an LO generator circuit that may comprise a PLL, a frequency synthesizer, and LO divider circuit that provides local oscillator phase continuity over a wide range of operating conditions.

In an exemplary embodiment, an LO divider circuit may be controlled to provide a known phase state at start-up, thereby relieving some or all of the local oscillator phase discontinuity at start-up.

In an exemplary embodiment, an LO divider circuit may use, or reuse, portions of a PLL circuit to determine a phase of the LO divider circuit, thereby relieving some or all of the local oscillator phase discontinuity at start-up.

Figure 1:
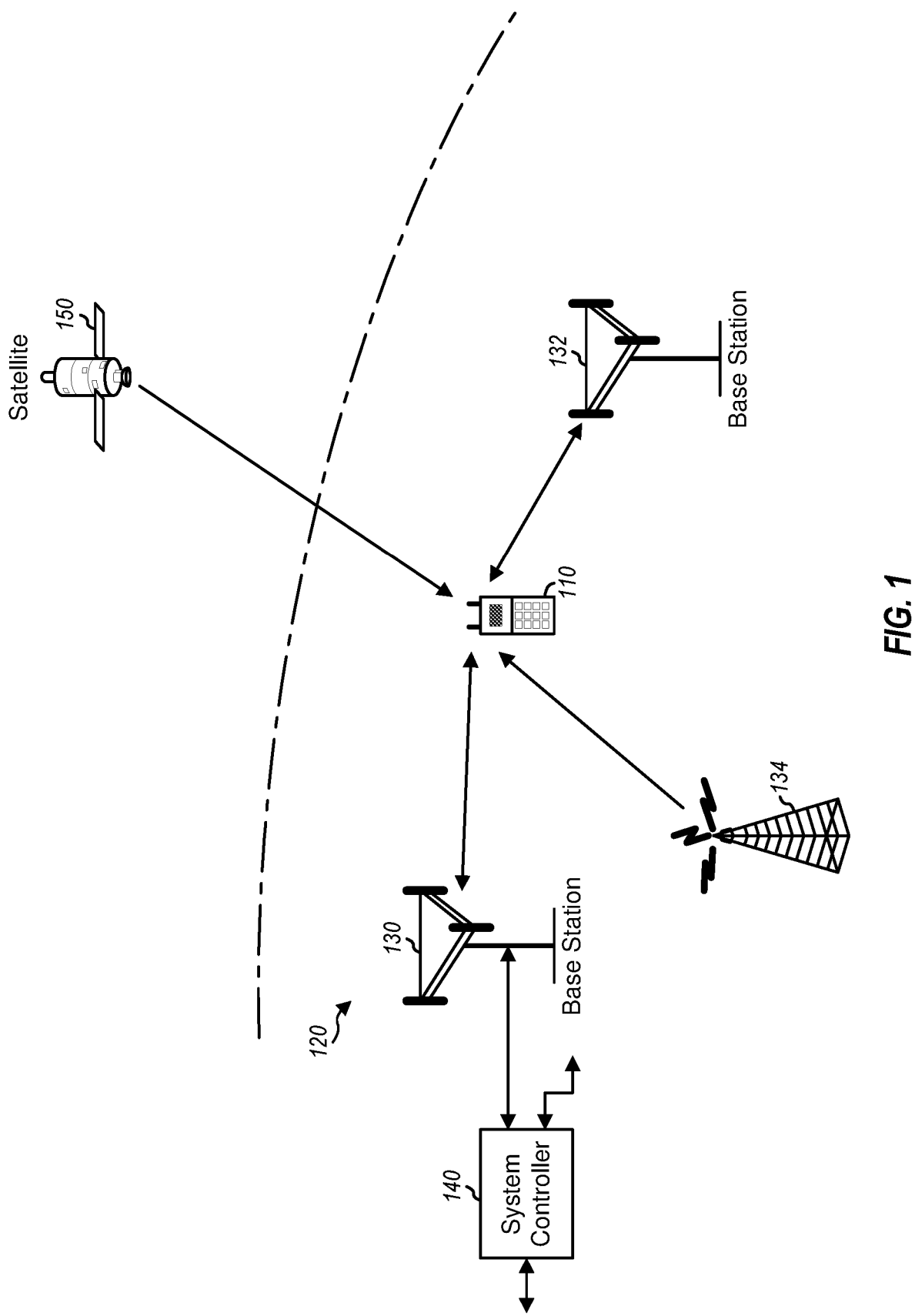
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
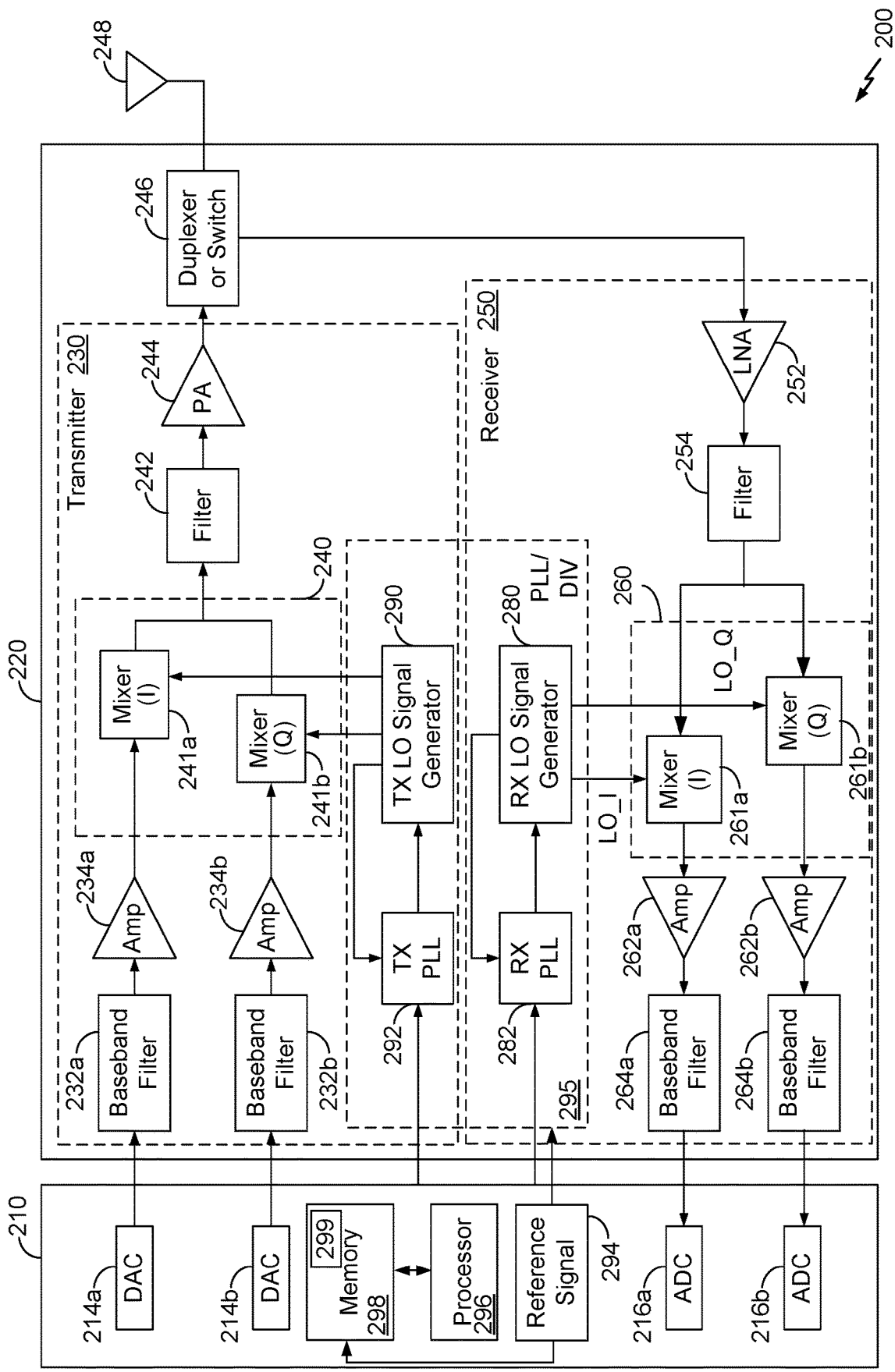
FIG. 2 is a block diagram showing a wireless device in which the exemplary techniques of the present disclosure may be implemented.

FIG. 2 is a block diagram showing a wireless device 200 in which the exemplary techniques of the present disclosure may be implemented. The wireless device 200 may, for example, be an embodiment of the wireless device 110 illustrated in FIG. 1.

FIG. 2 shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises the transceiver 220 and a data processor 210. The data processor 210 may include a processor 296 operatively coupled to a memory 298. The memory 298 may be configured to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214*a* and 214*b* for converting digital signals generated by the data processor 210 into the I and Q analog output signals, e.g., I and Q output currents, for further processing. In other embodiments, the DACs 214*a* and 214*b* are included in the transceiver 220 and the data processor 210 provides data (e.g., for I and Q) to the transceiver 220 digitally.

Within the transmitter 230, lowpass filters 232*a* and 232*b* filter the I and Q analog transmit signals, respectively, to remove undesired images caused by the prior digital-to-analog conversion Amplifiers (Amp) 234*a* and 234*b* amplify the signals from lowpass filters 232*a* and 232*b*, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248. While examples discussed herein utilize I and Q signals, those of skill in the art will understand that elements of the transceiver may be configured to utilize polar modulation.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261*a* and 261*b* in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262*a* and 262*b* and further filtered by lowpass filters 264*a* and 264*b* to obtain I and Q analog input signals, which are provided to data processor 210. In the exemplary embodiment shown, the data processor 210 includes analog-to-digital-converters (ADC's) 216*a* and 216*b* for converting the analog input signals into digital signals to be further processed by the data processor 210. In some embodiments, the ADCs 216*a* and 216*b* are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals. In an exemplary embodiment, a reference signal element 294 may be located in the data processor 210 or elsewhere in the wireless communication device 200 and be configured to provide a reference signal to the RX PLL 282 and the TX PLL 292. In some embodiments, a reference signal element 294 is implemented separate from the data processor 210 and/or is configured to generate a reference signal based on a signal from an oscillator, for example a crystal oscillator.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide linearity, efficiency, or a combination of linearity and efficiency.

Figure 3:
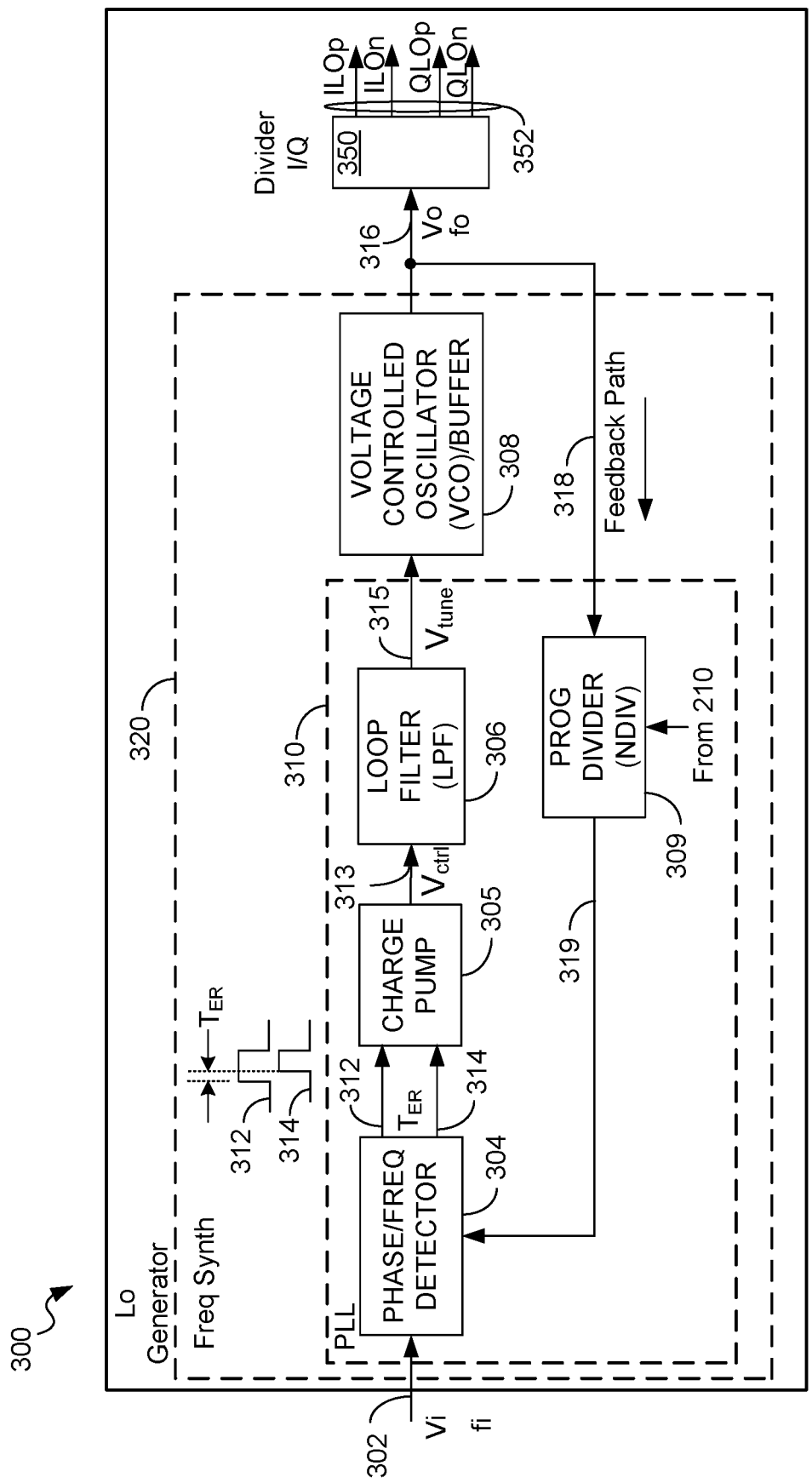
FIG. 3 is a block diagram of a local oscillator (LO) generator circuit of FIG. 2.

FIG. 3 is a block diagram of an LO generator circuit 300. In an exemplary embodiment, the LO generator circuit may be similar to an LO generator circuit 295 of FIG. 2 or to either of the generators 280, 290. In an exemplary embodiment, the LO generator circuit 300 may generate both TX LO signals and RX LO signals, or may generate only TX LO signals or only RX LO signals. In an exemplary embodiment, the LO generator circuit 300 may comprise a frequency synthesizer 320 having a PLL circuit 310 and a voltage-controlled oscillator (VCO) and buffer circuit 308. The LO generator circuit 300 may also comprise an LO divider 350. In an exemplary embodiment, the LO divider 350 may be a "divide-by-two" (DIV/2 or DIV2) divider that may be configured to generate in-phase and quadrature LO signals.

In an exemplary embodiment, the PLL circuit 310 includes a phase/frequency detector (PFD) 304, a charge pump 305, a loop filter 306, and a feedback circuit, which may comprise a programmable divider (NDIV) 309. In an exemplary embodiment, the loop filter 306 may be a low pass filter (LPF). The programmable divider (NDIV) 309 may be an integer-N divider or a fractional-N divider, and may also be referred to as a PLL divider.

An input signal Vi with an input phase and frequency fi is provided over connection 302 to the phase/frequency detector 304. In an exemplary embodiment, the phase/frequency detector 304 may comprise a comparator, or other circuitry, which compares the input phase and frequency on connection 302 with a feedback signal based on an output voltage signal, Vo, after processing by the programmable divider 309 on connection 319. The phase/frequency detector 304 provides two signals on connections 312 and 314 where the difference in time between the rising edges of the signals on connections 312 and 314 represents the timing error, $T_{ER}$, representing the phase and frequency difference between the input signals on connections 302 and 319. In an exemplary embodiment, the phase/frequency detector 304 compares the input phase on connections 302 and 319 and converts the phase difference into a timing error, $T_{ER}$, which can be represented by the amount of time occurring between two rising edges of two signals on connections 312 and 314. The timing error, $T_{ER}$, is then provided over connections 312 and 314 to the charge pump 305. The charge pump 305 then converts the timing error, $T_{ER}$, into a control voltage, $V_{ctrl}$. In response to the timing error signal, the charge pump 305, which may operate as a time-to-voltage converter, raises or lowers the DC voltage on connection 313 based on whether the timing error, $T_{ER}$, is increasing or decreasing, and generates the control voltage, $V_{ctrl}$, on connection 313. If the timing error, $T_{ER}$, is zero (0), then the output of the charge pump 305 is constant. The output of the charge pump 305 is provided over connection 313 to the loop filter 306. In an exemplary embodiment, the phase/frequency detector 304 and the charge pump 305 may be combined in a single functional block. In an exemplary embodiment where the loop filter 306 is a low pass filter, the loop filter 306 removes high frequency noise from the output signal of the charge pump 305 on connection 313 and provides a steady DC level VCO tuning voltage $V_{tune}$, on connection 315.

The DC voltage $V_{tune}$ is then provided to the VCO/buffer 308. The frequency (fo) of the output of VCO/buffer 308 is directly proportional to the input signal, Vi. Both the input phase and frequency, fi, and output phase and frequency, fo, are compared and adjusted through the feedback path 318 until the output frequency, fo, equals the input frequency, fi. The programmable divider 309 may be programmable by, for example, the data processor 210 of FIG. 2, to provide a divide-by-n function (NDIV).

The output of the frequency synthesizer 320 on connection 316 is provided to the LO divider 350. In an exemplary embodiment, the LO divider 350 may be a divide-by-two (DIV/2) circuit configured to reduce the frequency of the signal in connection 316 by a factor of two (2). Further, the LO divider may be configured to generate in-phase and quadrature signals separated by 90 degrees. Other divide ratios are possible.

In an exemplary embodiment, the LO divider 350 divides the VCO signal on connection 316 in frequency and provides four divided signals comprising ILOp, ILOn, QLOp and QLOn signals on connection 352, which are 90 degrees out of phase with respect to each other. In general, a differential signal comprises a non-inverting signal denoted by a suffix "p" and a complementary inverting signal denoted by a suffix "n". The ILOp and ILOn signals may be provided to a mixer 261a and/or 241a (FIG. 2) and the QLOp and QLOn signals may be provided to a mixer 261b and/or 241b (FIG. 2). Other divider ratios are possible, with a quadrature divider described for illustrative purposes only.

In an exemplary embodiment, the wireless device 110 may support communication with wireless systems utilizing TDD and/or FDD. For TDD, the downlink and uplink share the same frequency, and downlink transmissions and uplink transmissions may be sent on the same frequency in different time periods. For FDD, the downlink and uplink are allocated separate frequencies. Downlink transmissions may be sent on one frequency, and uplink transmissions may be sent on another frequency. Some exemplary radio technologies supporting TDD include LTE TDD, TD-SCDMA, and GSM. Some exemplary radio technologies supporting FDD include LTE FDD, WCDMA, and CDMA 1×.

When communicating with a wireless system utilizing TDD, wireless device 110 may power on/up at least some of the circuitry in receiver 250 only during receive (RX) time and may power off/down at least some of the receiver circuitry during non-RX time in order to conserve battery power. The RX time may cover time periods designated for the downlink and may cover just time periods that wireless device 110 needs to receive downlink signals. The non-RX time may cover all remaining time periods that are not part of the RX time. For example, wireless device 110 may power on RX LO generator 280 during RX time and may power off RX LO generator 280 during non-RX time. The RX LO generator 280 may thus operate in a non-continuous manner.

As shown in FIG. 3, LO generator 300 may include (i) frequency synthesizer 320 to generate the VCO signal at a suitable RF frequency and (ii) LO divider 350 to generate the LO signal. The frequency synthesizer 320 may be locked to the reference signal on connection 302 (FIG. 3) having a continuous phase and may thus generate the VCO signal having a continuous phase even though frequency synthesizer 320 may be continually powered on and off. However, the LO divider 350 may power up in one of a set of possible states. For example, the LO divider 350 may be a divide-by-2 divider and may arbitrarily wake up in either state '0' or '1' when it is powered on. The state of the LO divider 350 depends on which edge (e.g., rising or falling edge) of an incoming VCO signal triggers the LO divider 350 when the LO divider 350 awakens. Generally, a wake-up signal of a divider may not be timed or synchronized with a VCO signal in order to save battery power and reduce complexity of the divider. If a divide-by-2 divider misses one VCO edge (or one cycle), then the absolute phase of the divide-by-2 divider output is shifted by 180 degrees. The LO divider 350 may generate ILO and QLO signals having a first phase if it wakes up in state '0' and may generate the ILO and QLO signals having a second phase if it wakes up in state '1'. The ILO and QLO signals may then have non-continuous phase, which may be undesirable or unacceptable.

In an exemplary embodiment of the present disclosure, an LO signal having continuous phase may be generated by using a multi-phase divider (which generates the LO signal for a downconverter or an upconverter). The divider may be a divide-by-two I-Q divider that generates four divided signals that are in quadrature with one another, e.g., as shown in FIG. 3. The divider may also be an I-Q divider with another divider ratio that generates multiple divided signals of different phases.

The techniques described herein may enable a frequency synthesizer and a divider to generate an LO signal having continuous phase even when these circuits are periodically powered on and off, for example in order to conserve battery power. Exemplary embodiments may be used for an LO generator for a receiver as well as an LO generator for a transmitter.

Figure 4:
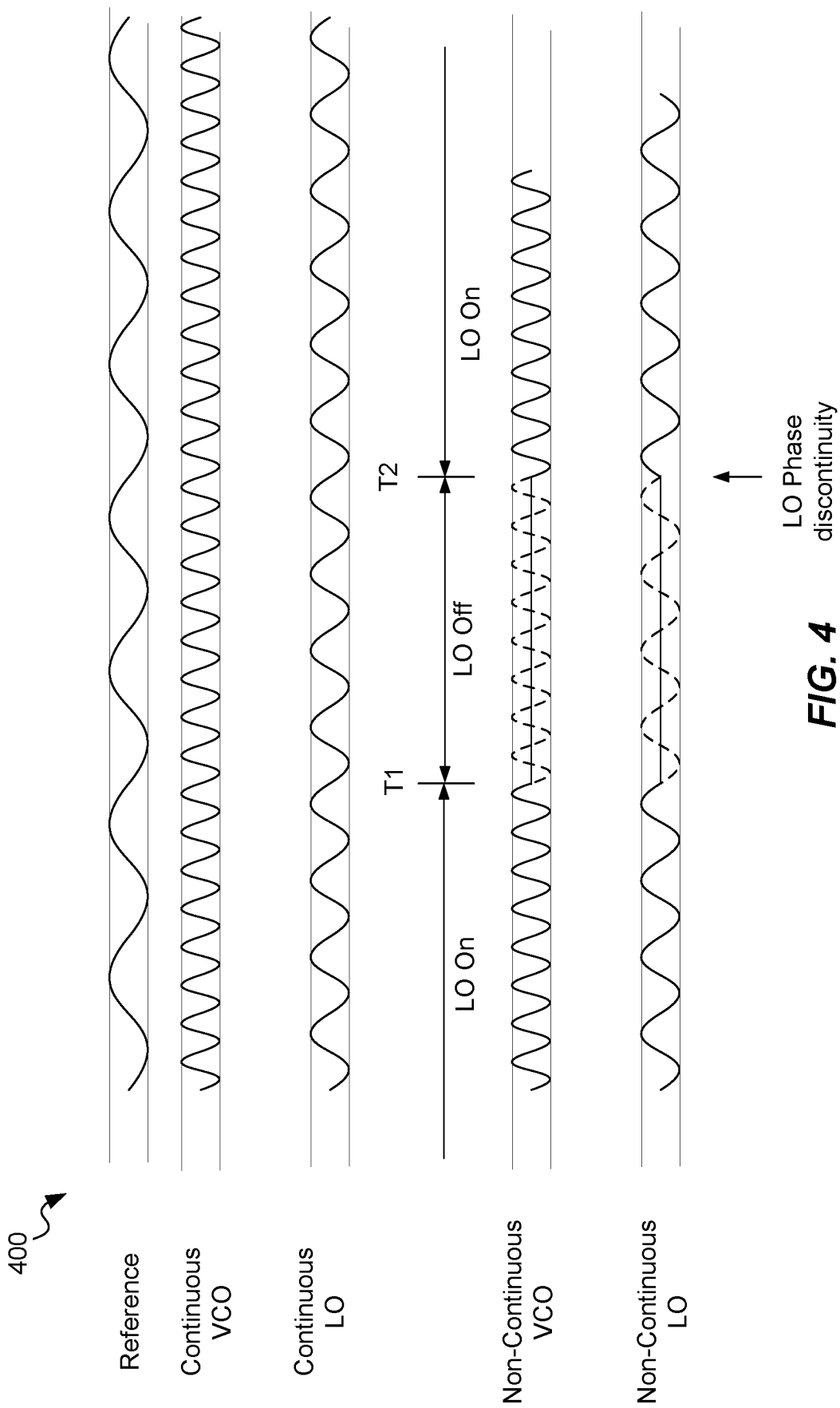
FIG. 4 shows a plurality of signals including an LO signal having a non-continuous phase due to a divider awakening in a different state when powered up.

FIG. 4 shows a plurality of signals including an LO signal having a non-continuous phase due to a divider awakening in a different state when powered up. A reference signal having a continuous phase is shown at the top of FIG. 4 and may be generated by reference signal generator 294 in FIG. 2, which may be powered on all the time. A continuous VCO signal may be generated by a first frequency synthesizer that is powered on all the time. A non-continuous VCO signal may be generated by a second frequency synthesizer that is periodically powered on and off. The non-continuous VCO signal may have continuous phase when the second frequency synthesizer is locked to the reference signal having continuous phase.

A continuous LO signal may be generated by dividing the continuous VCO signal and may have continuous phase. A non-continuous LO signal may be generated by a divider that divides the non-continuous VCO signal in frequency. The divider may operate in a first state (e.g., state '0') prior to being powered off at time T1 and may operate in a second state (e.g., state '1') after being powered on at time T2. Different states of the divider may be associated with different I-Q relationship of the ILO and QLO signals. The non-continuous LO signal may then have phase discontinuity at time T2 due to the divider being at a different state at time T2. In particular, the non-continuous LO signal may have a first phase prior to time T1 and a second phase after time T2, with the second phase being different from the first phase.

It may be beneficial for an LO signal provided to downconverter 260 in FIG. 2, for example, to have continuous phase over time (i.e., have no phase discontinuity). This may aid in properly downconverting an RF signal. Phase continuity may be achieved by powering on a frequency synthesizer and a divider all the time. However, significant battery power may be wasted to power on the frequency synthesizer and the divider, even when they are not needed for data processing, for example powering on an RX PLL/LO during uplink subframes, just to maintain phase continuity of the LO signal.

In an exemplary embodiment of the present disclosure, an LO signal having continuous phase may be generated by using a multi-phase divider (which generates the LO signal for a downconverter or an upconverter). The divider may be a divide-by-two I-Q divider that generates four divided signals that are in quadrature with one another. The divider may also be an I-Q divider with other divider ratio that generates multiple divided signals of different phases.

The techniques described herein may enable a frequency synthesizer and a divider to generate an LO signal having continuous phase even when these circuits are periodically powered on and off in order to conserve battery power. The techniques may be used for an LO generator for a receiver and/or for an LO generator for a transmitter. For clarity, various details of the techniques are described below for LO generator 280 in receiver 250 in FIG. 2, but those of skill in the art will understand that the techniques may be applied to the LO generator 290.

Figure 5:
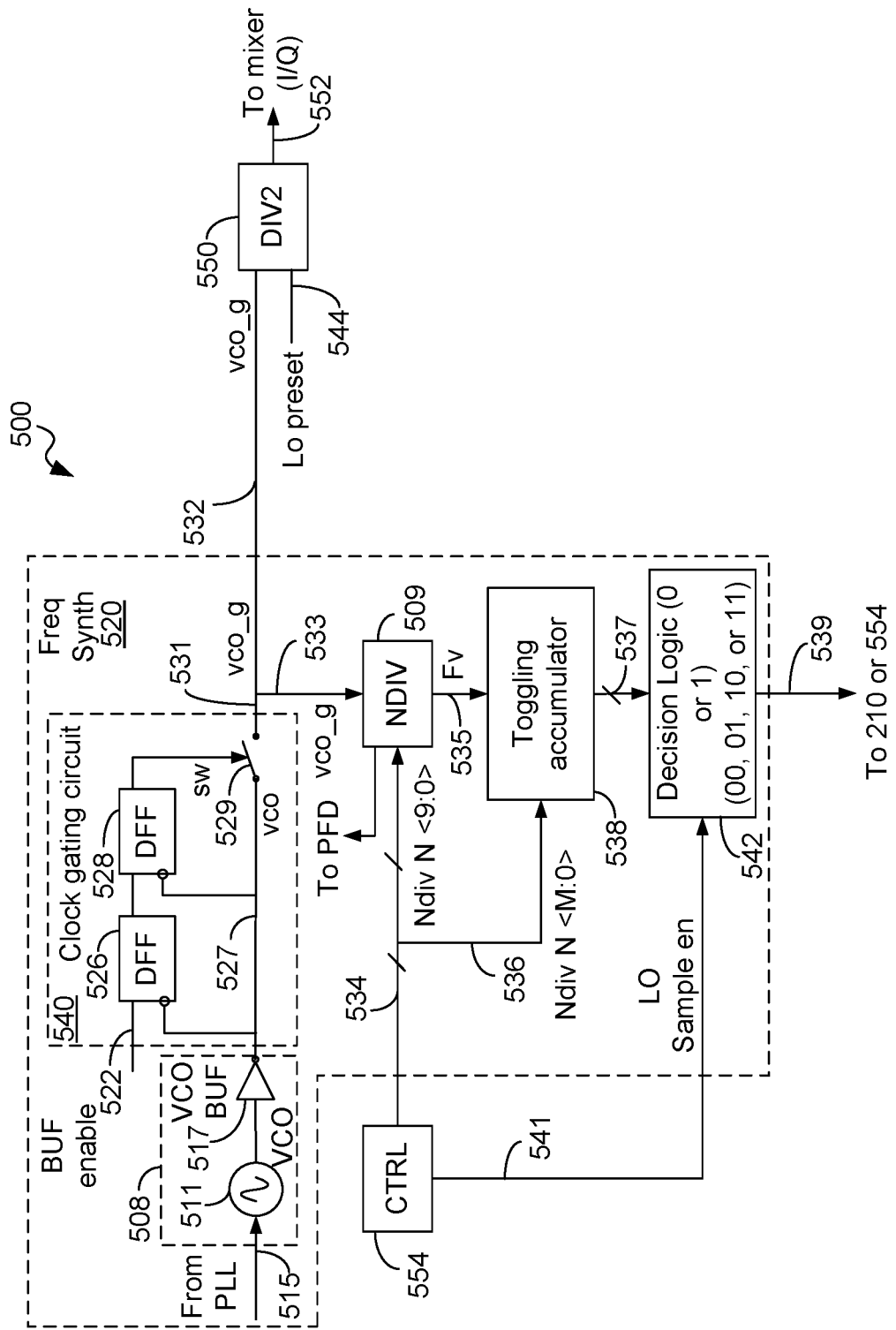
FIG. 5 is a block diagram showing additional detail of the local oscillator (LO) generator circuit of FIG. 3.

FIG. 5 is a block diagram 500 showing additional detail of the local oscillator (LO) generator circuit of FIG. 3. Elements in FIG. 5 that are similar to elements in FIG. 3 are referred to using the nomenclature 5XX, where an element in FIG. 5 labeled 5XX is similar to an element in FIG. 3 labeled 3XX. For example, the frequency synthesizer 520 in FIG. 5 is similar to, and may be an exemplary embodiment of, the frequency synthesizer 320 in FIG. 3.

In an exemplary embodiment, a frequency synthesizer 520 provides an output to an LO divider 550. The frequency synthesizer 520 comprises a VCO/buffer 508 having a VCO 511 and a buffer 517 schematically illustrated. The input to the VCO 511 originates from the PLL (not shown in FIG. 5) and is provided over connection 515. The frequency synthesizer 520 also comprises a clock gating circuit 540, a programmable divider (NDIV) 509, a toggling accumulator 538, and a decision logic 542.

The clock gating circuit 540 comprises a D-type flip-flop (DFF) 526 and a DFF 528. A buffer enable (BUF enable) signal is provided over connection 522 to enable the DFF 526. In an exemplary embodiment, the buffer enable signal may be generated by a controller 554 or by the data processor 210 of FIG. 2. In an exemplary embodiment, the controller 554 may be part of the data processor 210 of FIG. 2, or may be another control element. The output of the VCO buffer 517 on connection 527 is applied to the clock input of the DFF 526 and to the clock input of the DFF 528. The output of the DFF 526 is applied to the input of the DFF 528 to provide a delay. The output of the DFF 528 is applied to control the switch 529. The clock gating circuit 540 delays the appearance of the output of the VCO 511 and VCO buffer 517 on connection 531 until the VCO 511 reaches a steady output signal at a desired frequency in order to avoid metastability. Once the VCO 511 reaches a steady output signal, the DFF 528 closes the switch 529, that is the switch 529 becomes conductive, and the VCO output, "vco" appears at connection 531 and connection 532 as a gated vco signal, vco_g. The gated VCO signal vco_g may be a differential signal comprising complementary signals vco_g and vco_g bar (also shown in the drawings as vco_g with an overhead horizontal line). The vco_g signal may also be referred to as a differential clock signal, clkp, and the vco_g bar signal may also be referred to as a differential clock signal, clkm.

While the clock gating circuit 540 is illustrated as being composed of two flip flops and a switch, the clock gating circuit 540 may be implemented as any circuit configured to output a VCO signal on connection 532 when a steady output at a desired frequency is produced by the VCO 511. For example, delay elements other than flip flops may be used, a comparator may be used to evaluate when the frequency synthesizer has settled based on $T_{ER}$ (FIG. 3), and/or any other selective enable mechanism configured to receive an enable signal and selectively couple the VCO output to the LO divider 550 based thereon may be implemented.

The frequency synthesizer 520 also comprises a programmable divider 509. The programmable divider 509 may be similar to the programmable divider 309 in FIG. 3. In an exemplary embodiment, the programmable divider 509 is configured to receive a control signal from the controller 554 over connection 534. The control signal on connection 534 may be a multi-bit signal, for example Ndiv N<9:0> as illustrated in FIG. 5 when the control signal is 10 bits or containing any other number of bits depending on the design of the device, that communicates the NDIV division ratio to the programmable divider 509, and controls the rate at which the programmable divider 509 divides the vco_g signal on connection 533. For example, in the case where the VCO signal is divided by two (DIV2) to obtain the LO signal, the signal on connection 534 may comprise the least significant bit (LSB) of the signal, Ndiv N (that is, Ndiv N<0>) because in this exemplary embodiment, the divide ratio of the LO divider 550 is 2, resulting in two possible states, 0 and 180 degrees. Other LO divider ratios, such as DIV3, DIV4, DIV6, DIVE, etc., may be generated by using additional bits of the Ndiv N<9:0> signal on connection 534. For example, if the VCO signal is to be divided by four (4) (DIV4), then the least two bits (Ndiv N<0:1>) of the Ndiv N<9:0> signal on connection 534 may be used as input to the programmable divider 509 to control the NDIV division ratio, and to control the rate at which the programmable divider 509 divides the vco_g signal on connection 533. An output of the programmable divider 509 is provided to the PFD 304 of the PLL (not shown in FIG. 5). In addition to providing an integer-N or fractional-N output in the PLL 310 of FIG. 3, in an exemplary embodiment, the programmable divider 509 may also be configured as a counter. When configured as a counter, the programmable divider 509 may be configured to count pulses of the signal vco_g on connection 533.

An output of the programmable divider 509 on connection 535 is provided to the toggling accumulator 538. The signal on connection 535 is referred to as "Fv" and refers to a signal that triggers LO phase detection by the toggling accumulator 538. The Fv signal is generated every "N" cycles of the VCO 511, such that the programmable divider 509 counts the cycles of the signal provided by the VCO 511 from the time that the switch 529 is closed to the time that the LO phase detection trigger signal, Fv, is asserted. In an exemplary embodiment, in addition to being used to lock the PLL, the programmable divider 509 is also being simultaneously used to count VCO cycles. The value for "N" is determined by the Ndiv ratio, which is generated by the controller 554.

In an exemplary embodiment in which the division ratio is DIV2, the toggling accumulator 538 also receives a one-bit signal (Ndiv N<0>) over connection 536. In an exemplary embodiment where the VCO signal is divided by two (DIV2), the signal on connection 536 represents the least significant bit (LSB) of the Ndiv N<9:0> signal on connection 534 and is the same signal provided to the programmable divider 509 over connection 534. The signal on connection 536 is shown as "Ndiv N<M:0>" in FIG. 5 because the division ratio may be other than DIV2, where "M" depends on the division ratio. An example of such operation is described further below. The signal on connection 536 is used to allow the toggling accumulator 538 to determine the number of VCO cycles that occur from the time that the switch 529 is closed to the time that the Fv signal is asserted, and to determine whether the total number of VCO cycles is an odd (logic high (1)) or even (logic low (0)) number.

In an exemplary embodiment, the toggling accumulator 538 uses the LO phase detection trigger signal, Fv, on connection 535 to indicate a time at which to capture and store the number of times the vco_g signal has cycled since the clock gating circuit 540 caused the switch 529 to close. In an exemplary embodiment, the programmable divider 509 and the toggling accumulator 538 may operate as a counter.

An output of the toggling accumulator 538 is provided over connection 537 to the decision logic 542. The output of the toggling accumulator 538 is a signal representing the last bit captured by the toggling accumulator 538. For example, if the divide ratio is 2 (DIV2), the output of the toggling accumulator 538 is a one-bit signal that may either be a logic low (representing 0 degree phase) or a logic 1 (representing 180 degree phase). If the divide ratio is 4 (DIV4), the output of the toggling accumulator 538 is a two-bit signal that may be a 00 (representing 0 degree phase), a 01 (representing 90 degree phase), a 10 (representing 180 degree phase), or a 11 (representing 270 degree phase). Other outputs are possible from the decision logic depending on the divide ratio.

In a divide by 2 (DIV2) example, the decision logic 542 is triggered by an LO sample enable signal from the controller 554 over connection 541 and obtains the last logic bit of the output of the toggling accumulator 538. The decision logic 542 determines whether that last bit stored in the toggling accumulator 538 is odd (logic high (1) in this example) or even (logic low (0) in this example). The signal output from the decision logic 542 on connection 539 represents a predicted LO phase. In an exemplary embodiment where the LO divider 550 is a divide-by-two (DIV2) divider, the signal representing the predicted LO phase on connection 539 will be either even (representing a logic low, or 0 degree phase, no phase correction needed) or odd (representing a logic high, or 180 degree phase, phase correction needed). In an exemplary embodiment, the LO phase can be predicted by adding a predetermined LO phase, (e.g., initially setting the LO divider 550 to zero (0) degree output) to the output of the decision logic 542 on connection 539. The output of the decision logic 542 on connection 539 may be provided to the data processor 210 (FIG. 2) or to the controller 554 in the illustrated embodiment. In other embodiments, the decision logic 542 is implemented separate from the frequency synthesizer 520, for example in separate circuitry and/or within the data processor 210 or the controller 554. In an exemplary embodiment, the processor 296 in the data processor 210 compares the predicted LO phase with an actual LO phase, which may be stored in the memory 298 of the data processor 210 (FIG. 2). For example, the memory 298 (FIG. 2) may have a register 299 that can store the signal on connection 539 and also may receive a reference signal from the reference signal generator 294 (FIG. 2). The processor 296 may compare the predicted LO phase with the actual LO phase. If the predicted LO phase is the same as the actual LO phase stored in the memory 298 (FIG. 2), then no phase correction is initiated. However, if the predicted LO phase is not the same as the actual LO phase stored in the memory 298 (FIG. 2), then the divider ratio provided to the programmable divider 509 by the controller 554 can be changed to correct the phase so that phase continuity is maintained.

In an exemplary embodiment where a division ratio other than two is implemented, for example, a divide by 4 (DIV4), then the decision logic may be configured to implement a modulus four (4) (MOD4) function in which there may be four (4) output states of the decision logic 542, those being "00" (corresponding to a phase of 0 degrees), "01" (corresponding to a phase of 90 degrees), "10" (corresponding to a phase of 180 degrees), and "11" (corresponding to a phase of 270 degrees).

Those of skill in the art will understand that the programmable divider 509 and the toggling accumulator 538 are only examples, and that any circuitry configured to count cycles of the VCO output and/or provide a signal or other indication of a phase of the VCO output may be implemented. For example, in embodiments with a static divide ratio of 2, circuitry that toggles between 0 and 1 at every cycle may be used. In other embodiments, a counter separate from the programmable divider 509 may be implemented and may output a total count or a value representing a modulus as compared to the divide ratio. In some such embodiments, this value is output directly to the decision logic 542. In other embodiments, a peak detector is employed. In yet other embodiments, the FV signal illustrated in FIG. 5 is input directly to the decision logic 542 (and the toggling accumulator 538 may be omitted), as is the NDIV division ratio, and the decision logic 542 is configured to determine a predicted LO phase based thereon. It will be appreciated that in embodiments where a programmable or adjustable divide ratio is desired, configuring the programmable divider 509 (and the toggling accumulator 538 in some such embodiments) as described above with respect to the embodiment illustrated in FIG. 5 may allow reuse of NDIV circuitry in the PLL for detection/determination of a phase of the VCO. This may reduce size, cost, and/or complexity of the LO generator and mobile device in which it is disposed.

In addition to being used for phase detection/determination, as described above, the vco_g signal on connection 532 is also provided to the LO divider 550. The LO divider 550 is similar to the divider 350 of FIG. 3. An LO preset signal is also provided to the LO divider 550 over connection 544. The LO preset signal may be a differential signal comprising complementary signals LO preset and LO preset bar (also shown in the drawings as LO preset with an overhead horizontal line). The LO preset signal may be generated by the data processor 210 of FIG. 2 or the controller 554, for example. The LO preset signal that is applied to the LO divider 550 (assuming the LO divider 550 has been inactive) sets the LO divider 550 to a predetermined initial phase. In an exemplary embodiment, the predetermined initial phase may be zero (0) degrees. The LO preset signal is then released (or toggled) before the application of the BUF enable signal on connection 522 to allow the LO divider to operate to divide the vco_g signal as soon as the output of the VCO 511 appears on connection 532.

Figure 6:
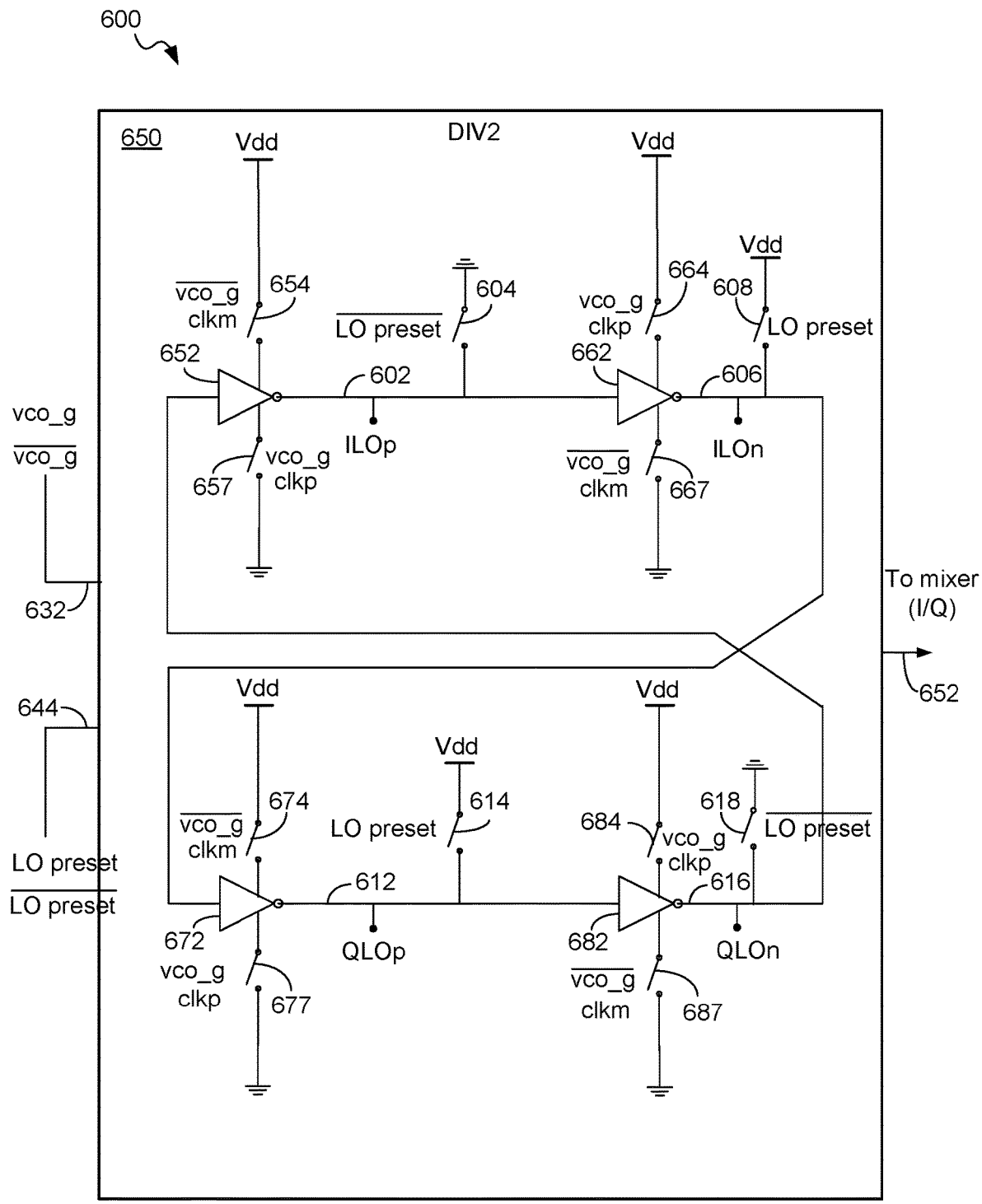
FIG. 6 is a block diagram showing additional detail of an I/Q divider in the local oscillator (LO) generator circuit of FIG. 5.

FIG. 6 is a block diagram showing additional detail of an LO divider in the local oscillator (LO) generator circuit of FIG. 5. In an exemplary embodiment, the LO divider 650 is an exemplary embodiment of the LO divider 550 of FIG. 5. In an exemplary embodiment, the LO divider 650 is an example of an I/Q divider configured to generate the ILOp, ILOn, QLOp and QLOn LO signals described above.

The vco_g and vco_g bar signals may be provided over connection 632 and the LO preset and LO preset bar signals may be provided over connection 644.

In an exemplary embodiment, the LO divider 650 comprises an inverter 652 coupled to a system voltage signal, VDD, through a switch 654. The inverter 652 is coupled to a system ground through a switch 657. In an exemplary embodiment, the switch 654 may be controlled by a clkm (vco_g bar) signal and the switch 657 may be controlled by a clkp (vco_g) signal.

In an exemplary embodiment, the LO divider 650 comprises an inverter 662 coupled to a system voltage signal, VDD, through a switch 664. The inverter 662 is coupled to a system ground through a switch 667. In an exemplary embodiment, the switch 664 may be controlled by a clkp (vco_g) signal and the switch 667 may be controlled by a clkm (vco_g bar) signal.

In an exemplary embodiment, the LO divider 650 comprises an inverter 672 coupled to a system voltage signal, VDD, through a switch 674. The inverter 672 is coupled to a system ground through a switch 677. In an exemplary embodiment, the switch 674 may be controlled by a clkm (vco_g bar) signal and the switch 677 may be controlled by a clkp (vco_g) signal.

In an exemplary embodiment, the LO divider 650 comprises an inverter 682 coupled to a system voltage signal, VDD, through a switch 684. The inverter 682 is coupled to a system ground through a switch 687. In an exemplary embodiment, the switch 684 may be controlled by a clkp (vco_g) signal and the switch 687 may be controlled by a clkm (vco_g bar) signal.

An output of the inverter 652 may be taken over connection 602 and may comprise an ILOp signal. The connection 602 may also be coupled to system ground through a switch 604. The switch 604 may be controlled by the LO preset bar signal. An input to the inverter 652 may be provided over connection 616 from the output of the inverter 682.

An output of the inverter 662 may be taken over connection 606 and may comprise an ILOn signal. The connection 606 may also be coupled to system voltage, VDD, through a switch 608. The switch 608 may be controlled by the LO preset signal. An input to the inverter 662 may be provided over connection 602 from the output of the inverter 652.

An output of the inverter 672 may be taken over connection 612 and may comprise an QLOp signal. The connection 612 may also be coupled to system voltage, VDD, through a switch 614. The switch 614 may be controlled by the LO preset signal. An input to the inverter 672 may be provided over connection 606 from the output of the inverter 662.

An output of the inverter 682 may be taken over connection 616 and may comprise an QLOn signal. The connection 616 may also be coupled to system ground through a switch 618. The switch 618 may be controlled by the LO preset bar signal. An input to the inverter 682 may be provided over connection 612 from the output of the inverter 672.

In an exemplary embodiment, when the LO preset signal causes the switch 608 and the switch 614 to be conductive, it pulls up to the system voltage VDD an internal node of the inverter 662 on connection 606 and an internal node of the inverter 672 on connection 612. When the LO preset bar signal causes the switch 604 and the switch 618 to be conductive, it pulls down to system ground an internal node of the inverter 652 on connection 602 and an internal node of the inverter 682 on connection 616. This causes the output of the LO divider 650 to be preset to a known initial (predetermined) state before providing a divider output. In an exemplary embodiment, the known initial (predetermined) state may be a state that causes the output of the LO divider 650 to be zero (0) degrees.

Figure 7:
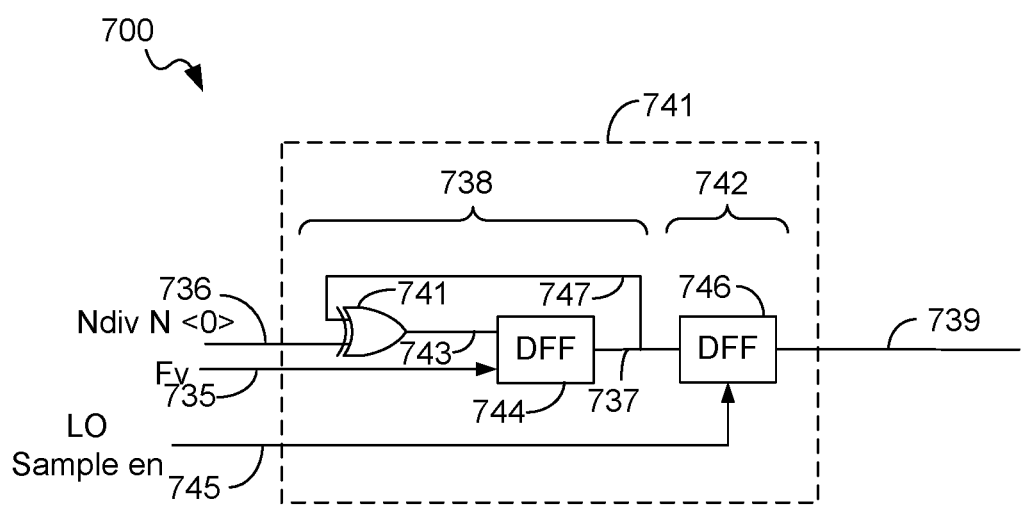
FIG. 7 is a block diagram showing additional detail of a toggling accumulator in the local oscillator (LO) generator circuit of FIG. 5.

FIG. 7 is a block diagram 700 showing a circuit 741 including additional detail of a toggling accumulator 738 and a decision logic 742 in the local oscillator (LO) generator circuit of FIG. 5. In an exemplary embodiment, the toggling accumulator 738 is similar to the toggling accumulator 538 of FIG. 5 and the decision logic 742 is similar to the decision logic 542 of FIG. 5. In an exemplary embodiment, the toggling accumulator 738 comprises an exclusive-OR gate 741, and a D-type flip-flop (DFF) 744. In an exemplary embodiment, the decision logic 742 comprises a D-type flip-flop 746. The exclusive-OR gate 741 may be configured to receive the Ndiv N<0> signal over connection 736 and the output of the DFF 744 over connection 747 as a feedback signal. The Fv signal may be provided to the clock input of the DFF 744 over connection 735. An output of the exclusive-OR gate 741 is provided over connection 743 to the D input of the DFF 744. The Q output of the DFF 744 is provided over connection 737 to the D input of the DFF 746.

The LO sample enable signal is provided over connection 745 to the clock input of the DFF 746. An output (Q) of the DFF 746 is provided over connection 739 and represents the predicted LO phase.

Figure 8:
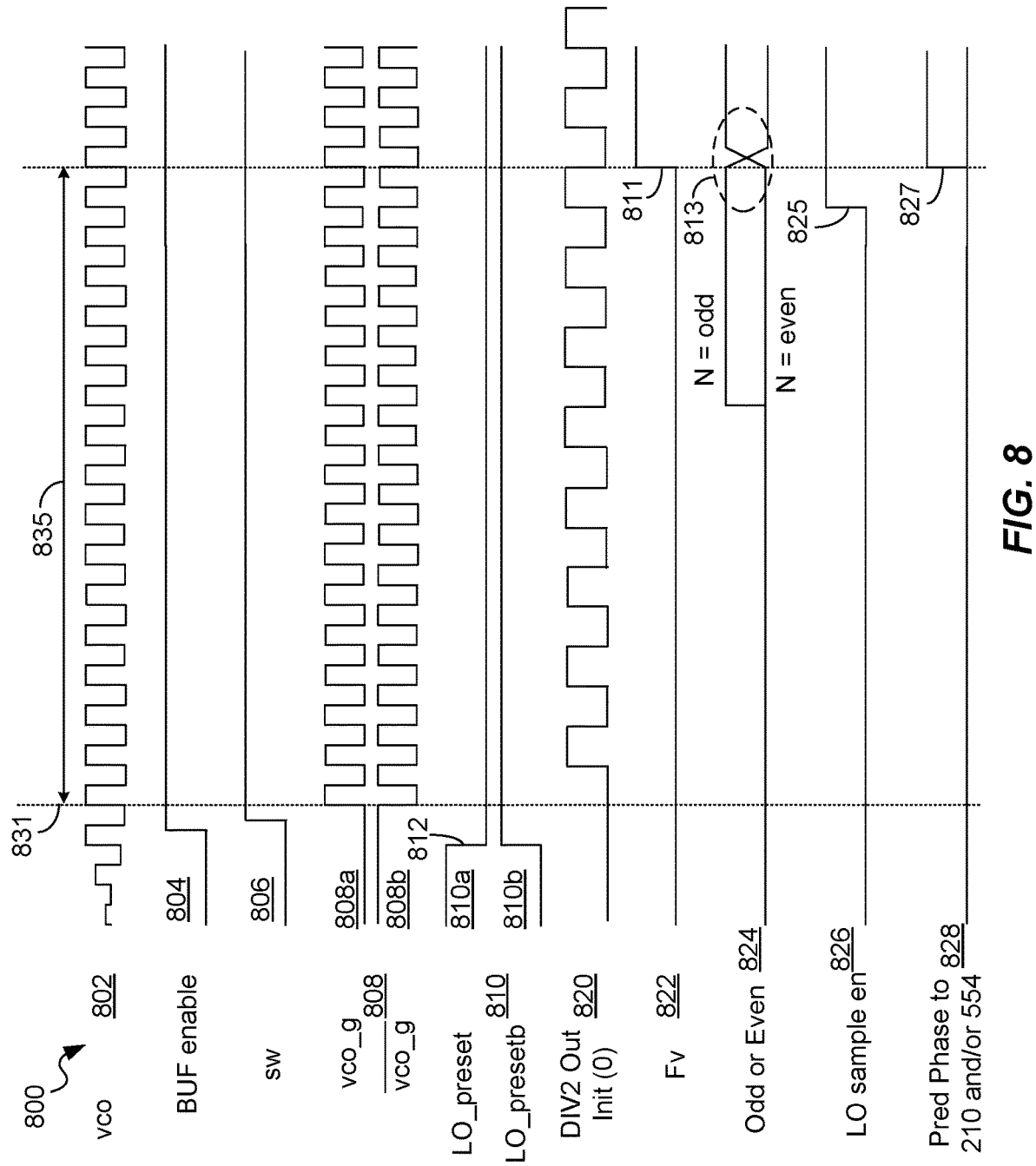
FIG. 8 is a schematic diagram showing the signals and signal timing of the LO generator circuit of FIG. 5 and the LO divider shown in FIG. 6 during start-up.

FIG. 8 is a schematic diagram 800 showing the signals and signal timing of the LO generator circuit of FIG. 5 and the LO divider shown in FIG. 6 during each start-up (e.g., when powering on the LO generator and LO divider after a period of being powered off).

As the VCO 511 powers up and begins generating the vco signal 802, the BUF enable signal 804 is applied to the DFF 526. Shortly thereafter, the "sw" signal 806 asserts and enables the switch 529 to conduct and the vco_g signal 808 (comprising vco_g signal 808a and its complement, the vco_g bar signal 808b) appears at connection 532 and connection 533.

The vco_g signal 808 is applied over connection 532 to the LO divider 550, and the vco_g signal is applied over connection 533 to the programmable divider 509. Applying the same vco_g signal to the LO divider 550 and to the programmable divider 509 allows the programmable divider 509 to accurately count the number of VCO cycles applied to the LO divider 550 from the time that the BUF signal 804 is applied to the clock gating circuit 540 (FIG. 5) to the time that the Fv signal 822 is generated by the programmable divider 509. In an exemplary embodiment, prior to the VCO output being provided over connection 532 and connection 533, the LO preset signal 810 (comprising LO preset signal 810a and its complement, the LO preset bar signal 810b) is applied over connection 544 to the LO divider 550. The LO preset signal 810 is provided to the LO divider 550 (and 650, FIG. 6), including the LO preset signal 810a and its complement the LO preset bar signal 810b, after any period of LO inactivity. The application of the LO preset signal 810 presets the initial phase of the LO divider to a predetermined initial phase. In an exemplary embodiment, the predetermined initial phase may be, for example, zero (0) degrees. At time 812, the LO preset signal is released.

The programmable divider 509 receives the vco_g signal 808 over connection 533, and receives the above-mentioned divider control signal over connection 534; and generates the Fv signal 822 over connection 535. The programmable divider 509 acts as a cycle counter and the clock gating circuit 540 ensures that the same number of VCO toggling pulses (cycles) occur on both the LO path (connection 532, FIG. 5) and on the programmable divider path (connection 533, FIG. 5) after the BUF enable signal 804 asserts. By ensuring that the same number of VCO toggling pulses occur on both the LO path (connection 532) and on the programmable divider path (connection 533) after the BUF enable signal 804 asserts, the programmable divider 509 can be used to count the number of VCO cycles toggling in the LO path from the time that the BUF enable signal 804 asserts to the time that the Fv signal 822 is generated.

The Fv signal 822 on connection 535 is applied to the toggling accumulator 538. The toggling accumulator 538 also receives the above-mentioned divider control signal over connection 536, and the LO sample enable signal 826 over connection 541. In an exemplary embodiment, the Fv signal 822 comprises the vco_g signal 808 divided by the control signal Ndiv N<9:0> on connection 534.

In an exemplary embodiment, the LO sample enable signal 826 may be asserted at time 825 after the BUF enable signal 804 is asserted and after the vco_g signal 808 (comprising vco_g signal 808a and its complement, the vco_g bar signal 808b) becomes stable at time 831. The LO sample enable signal 826 triggers LO phase prediction when the PLL and LO start up and after the vco_g signal 808 becomes stable. The LO sample enable signal 826 is triggered once for each startup for phase prediction and correction.

The programmable divider 509 and the toggling accumulator 538 count, capture and store the number of times that the vco_g signal 808 toggles from the time 831 to the time 811 at which the Fv signal 822 asserts, that is, changes state. This time period is shown using reference numeral 835. The output of the toggling accumulator 538 on connection 537 represents the count, or number of times the vco_g signal toggles, which is represented by the state of the "odd or even" signal 824 at time 811 when the Fv signal 822 toggles. At the time 811 when the Fv signal 822 toggles, the state of the odd or even signal 824 represents the state of the toggling accumulator 538 (as described above with respect to FIG. 5) and will be either odd or even in the illustrated example, which may correspond to an operation of DIV2. Both states are shown in FIG. 8 to illustrate that the odd or even signal 824 may toggle from logic low to logic high, or from logic high to logic low in this exemplary embodiment. The state of the toggling accumulator 538 may be represented in ways other than with the odd or even signal 824. For example, the state of the toggling accumulator may re represented differently for DIV4 operation.

The output of the toggling accumulator 538 on connection 537 is provided to the decision logic 542. The decision logic 542 determines the phase (state, 0 or 1 in this example, corresponding to the last bit in the toggling accumulator 538) and generates the "predicted LO phase" signal 828, which is provided to the data processor 210 (FIG. 2) and/or controller 554 (FIG. 5). If the state of the predicted LO phase is odd in this example (meaning an odd number of vco_g cycles have been counted), then the output of the detection logic 542 is set to logic high; and if the state of the predicted LO phase is even in this example (meaning an even number of vco_g cycles have been counted), then the output of the detection logic 542 is set to logic low. Both logic low and logic high states of the predicted LO phase signal 828 are shown in FIG. 8 to correspond to the two possible states of the odd or even signal 824 at time 811. For example, at time 811 when the Fv signal 822 toggles, the state of the odd or even signal 824 will be either logic low (even) or logic high (odd). The state of the odd or even signal 824 at time 811 is then used to develop the state of the predicted LO phase signal 828 at time 827. The region 813 shows that the state of the odd or even signal 824 may be either logic high or logic low at the time the Fv signal 822 toggles at time 811. The data processor 210 (FIG. 2) and/or controller 554 (FIG. 5) compares the predicted LO phase captured at time 827 with the correct LO phase which is stored in the memory 298 (FIG. 2). If the predicted LO phase is the same as the actual LO phase, the current LO phase is continuous and no phase correction is done. If there is any difference between the predicted LO phase and the actual LO phase, then the LO phase is corrected by, for example, shifting the output of the programmable divider 509. In an example where the LO divider 550 is a divide-by-two divider (DIV2), if the LO phase is discontinuous, the NDIV ratio on connection 534 (FIG. 5) may be reduced by 1. In this manner, it is possible to predict the phase of the LO divider output and if needed, correct the phase of the LO divider 550 to provide a continuous LO signal from the LO divider 550 even after a period of inactivity.

In an exemplary embodiment, using the programmable divider 509 to count the pulses of the vco_g signal in addition to providing the divider signal for the PLL obviates the need for a separate delay locked loop (DLL) circuit, or other circuitry to provide LO timing alignment. This reuse of the programmable divider 509 to count the pulses of the vco_g signal reduces chip area and simplifies circuit layout and design because the LO phase continuity function becomes part of the function of the programmable divider and the LO circuitry.

Figure 9:
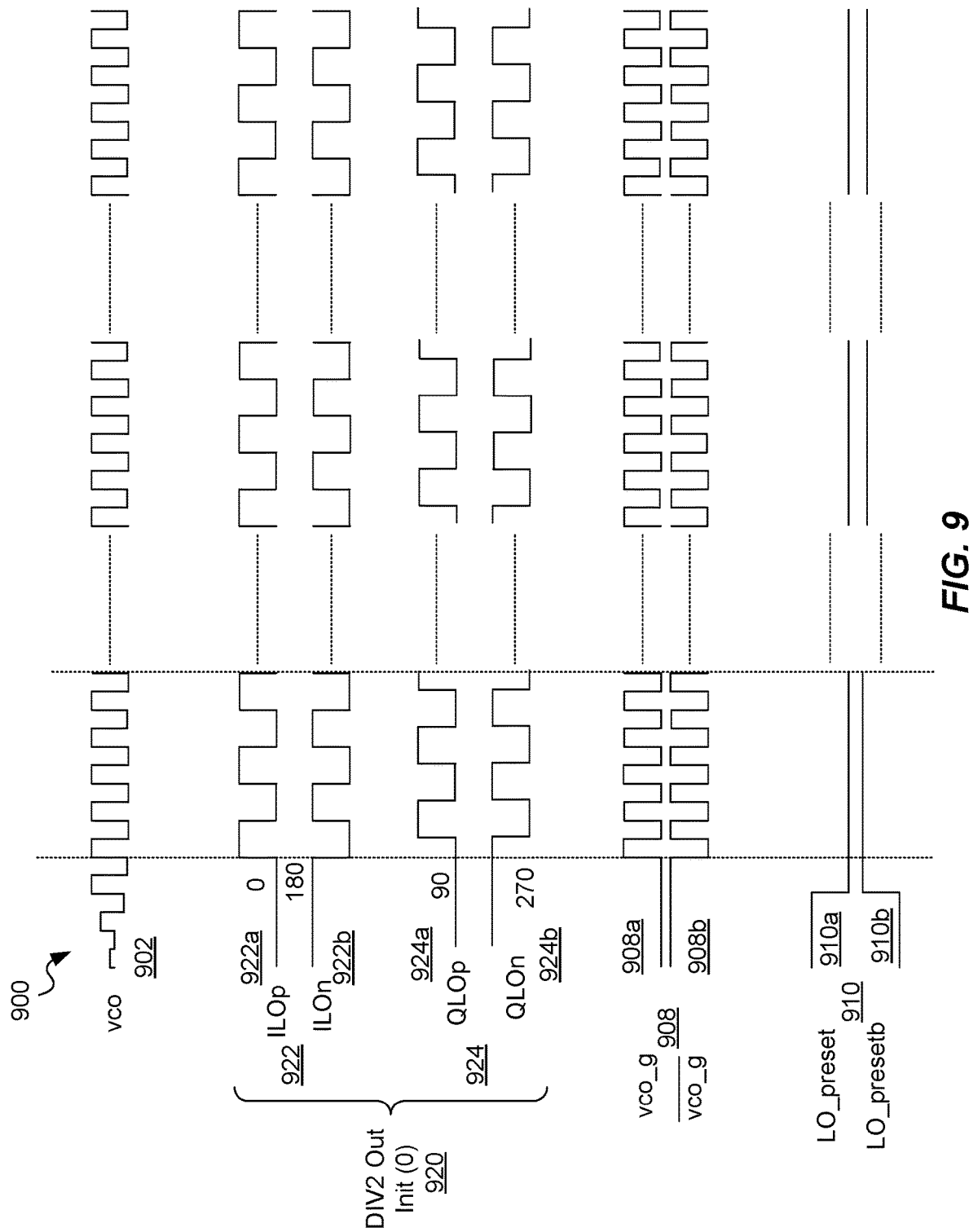
FIG. 9 is a schematic diagram showing the signals and signal timing of the LO generator circuit of FIG. 5 and the LO divider of FIG. 6.

FIG. 9 is a schematic diagram showing the signals and signal timing of the LO generator circuit of FIG. 5 and the LO divider of FIG. 6. The vco signal 902 is shown for reference. In an exemplary embodiment where the LO divider 650 is an I/Q divider, the output of the LO divider 650 is collectively shown using reference numeral 920. In an exemplary embodiment, the output of the LO divider 650 comprises in-phase LO signals 922 and quadrature LO signals 924. The in-phase LO signals 922 comprise an ILOp signal 922*a* and an ILOn signal 922*b*. Similarly, the quadrature LO signals 924 comprise an QLOp signal 924*a* and an QLOn signal 924*b*. The ILOp signal 922*a* and the ILOn signal 922*b* are opposite in phase by 180 degrees. The QLOp signal 924*a* and the QLOn signal 924*b* are also opposite in phase by 180 degrees, and are offset from the ILOp signal 922*a* and the ILOn signal 922*b* by 90 degrees.

The vco_g signal 908*a* and vco_g bar signal 908*b* are shown for reference, as are the LO preset signal 910*a* and LO preset bar signal 910*b*.

Figure 10:
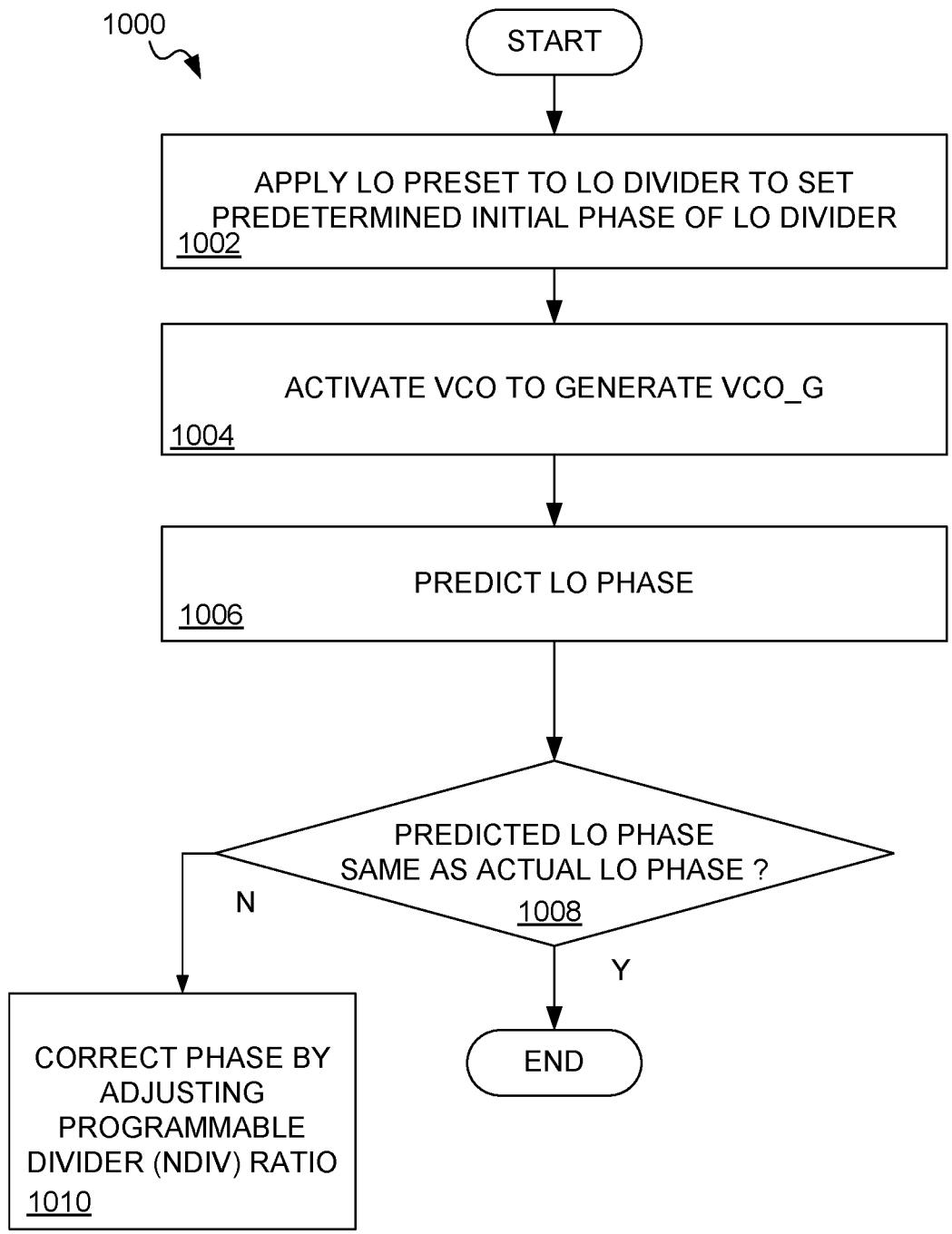
FIG. 10 is a flow chart describing an example of the operation of an LO generator circuit in accordance with an exemplary embodiment of the disclosure.

FIG. 10 is a flow chart 1000 describing an example of the operation of a method for establishing local oscillator phase. The blocks in the method 1000 can be performed in or out of the order shown, and in some embodiments, can be performed at least in part in parallel.

In block 1002, the LO preset signal is applied to the LO divider 550 to set a predetermined initial phase of the LO divider 550. In an exemplary embodiment, the LO divider 550 may be preset to an initial phase of 0 degrees.

In block 1004, a signal is generated using a voltage-controlled oscillator (VCO), such as the VCO 511 described above with respect to FIG. 5. The VCO 511 may be activated and the output may be buffered and passed to the clock gating circuit 540. The clock gating circuit 540 provides the VCO output, vco_g, as a steady output at a desired frequency. In some embodiments, the clock gating circuit 540 is activated upon assertion of the BUF enable signal, and asserts the "sw" signal based thereon.

In block 1006, the LO phase is predicted. In an exemplary embodiment, the programmable divider 509 and the toggling accumulator 538 are used to count, capture and store the number of pulses of the vco_g signal that occur from the time that the BUF enable signal on connection 522 (FIG. 5) asserts to the time that the Fv signal on connection 535 toggles. The LO phase may be predicted by adding the predetermined initial phase (initially set to 0) to the output of the decision logic 542 (FIG. 5). For example, in a divide by 2 (DIV2) example, the decision logic 542 may determine whether the last bit in the toggling accumulator 538 corresponds to an odd or even number of pulses, representing 0 degree phase or 180 degree phase.

In block 1008, it is determined whether the predicted LO phase is the same as the actual LO phase stored in the data processor 210 (FIG. 2) and/or the controller 554 (FIG. 5). If in block 1008 it is determined that the predicted LO phase is the same as the actual LO phase, then no phase correction is warranted and the process ends. If it is determined in block 1008 that the predicted LO phase is not the same as the actual LO phase, then, in block 1010, the LO phase provided by the LO divider 550 may be corrected. For example, the LO phase may be corrected by shifting the output of the programmable divider 509. In an example where the LO divider 550 is a divide-by-two divider (DIV2), if the LO phase is discontinuous, the NDIV ratio on connection 534 (FIG. 5) may be reduced by 1.

Figure 11:
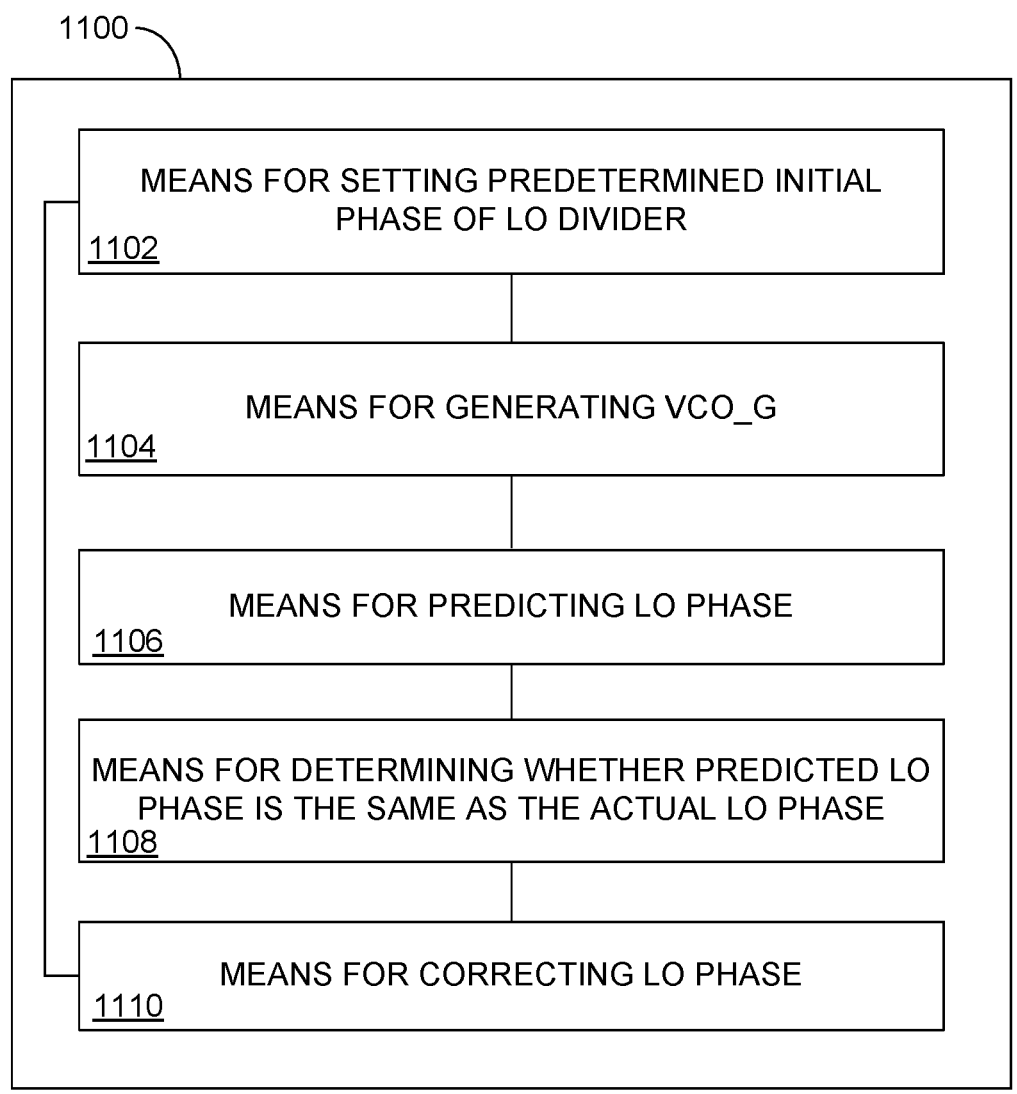
FIG. 11 is a functional block diagram of an apparatus for an LO generator circuit in accordance with an exemplary embodiment of the disclosure.

FIG. 11 is a functional block diagram of an apparatus for establishing local oscillator phase in accordance with an exemplary embodiment of the disclosure.

The apparatus 1100 comprises means 1102 for setting an initial predetermined local oscillator (LO) phase. In certain embodiments, the means 1102 for setting an initial predetermined local oscillator (LO) phase can be configured to perform one or more of the functions described in operation block 1002 of method 1000 (FIG. 10). In an exemplary embodiment, the means 1102 for setting an initial predetermined local oscillator (LO) phase may comprise circuitry configured to apply the LO preset signal to the LO divider 550 of FIG. 5, or the LO divider 650 of FIG. 6.

The apparatus 1100 also comprises means 1104 for generating a VCO signal output, vco_g. In certain embodiments, the means 1104 for generating a VCO signal output, vco_g can be configured to perform one or more of the functions described in operation block 1004 of method 1000 (FIG. 10). In an exemplary embodiment, the means 1104 for generating a VCO signal output, vco_g may comprise circuitry configured to activate the VCO 511 and the VCO buffer 517, apply the VCO output to the clock gating circuit 540, and make the switch 529 conductive.

The apparatus 1100 also comprises means 1106 for predicting the LO phase. In certain embodiments, the means 1106 for predicting the LO phase can be configured to perform one or more of the functions described in operation block 1006 of method 1000 (FIG. 10). In an exemplary embodiment, the means 1106 for predicting the LO phase may comprise the programmable divider 509 and the toggling accumulator 538 counting the number of pulses of the vco_g signal that occur from the time that the BUF enable signal on connection 522 (FIG. 5) asserts to the time that the Fv signal on connection 535 toggles and may comprise the decision logic 542 configured to determine whether the last bit in the toggling accumulator represents an odd or an even number of pulses.

The apparatus 1100 also comprises means 1108 for determining whether the predicted LO phase is the same as the actual LO phase. In certain embodiments, the means 1108 for determining whether the predicted LO phase is the same as the actual phase can be configured to perform one or more of the functions described in operation block 1008 of method 1000 (FIG. 10). In an exemplary embodiment, the means 1108 for determining whether the predicted LO phase is the same as the actual phase may comprise circuitry configured to compare the predicted LO phase with the actual LO phase in the data processor 210 (FIG. 2).

The apparatus 1100 also comprises means 1110 for correcting the LO phase. In certain embodiments, the means 1110 for correcting the LO phase can be configured to perform one or more of the functions described in operation block 1010 of method 1000 (FIG. 10). In an exemplary embodiment, the means 1110 for correcting the LO phase may comprise circuitry configured to correct the LO phase by shifting the output of the programmable divider 509. In an example where the LO divider 550 is a divide-by-two divider (DIV2), if the LO phase is discontinuous, the NDIV ratio on connection 534 (FIG. 5) may be reduced by 1.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A local oscillator (LO) circuit, comprising:
    a voltage controlled oscillator (VCO) configured to receive an output of a phase locked loop (PLL) circuit, the VCO coupled to a clock gating circuit configured to generate a VCO output signal (vco_g);
    a local oscillator (LO) divider configured to receive the VCO output signal (vco_g) and a local oscillator (LO) preset signal, the LO preset signal configured to set the LO divider to a predetermined initial phase;
    a programmable divider configured to receive a divider signal and the VCO output signal (vco_g) and generate a local oscillator (LO) phase detection trigger signal, Fv;
    a toggling accumulator coupled to an output of the programmable divider, the toggling accumulator configured to receive the divider signal and the LO phase detection trigger signal, Fv, and generate a counter signal; and
    a decision logic configured to receive a sample enable signal and the counter signal and adjust the programmable divider based on the sample enable signal and the counter signal.

2. The local oscillator (LO) circuit of claim 1, wherein the LO divider is an in-phase/quadrature (I/Q) divide by two (DIV2) LO divider and further comprises:
    a plurality of inverters; and
    a plurality of switches coupled to the plurality of inverters, the plurality of switches configured to receive the LO preset signal, the LO preset signal configured to set a predetermined phase of the LO divider after a period of local oscillator inactivity and prior to activation of the VCO.

3. The local oscillator (LO) circuit of claim 1, wherein the predetermined initial phase of the LO divider is selected from 0 degrees and 180 degrees.

4. The local oscillator (LO) circuit of claim 1, wherein a data processor is configured to compare the predicted LO phase with an actual LO phase.

5. The local oscillator (LO) circuit of claim 4, wherein the data processor is configured to adjust the divider signal so that the predicted LO phase matches the actual LO phase when the predicted LO phase differs from the actual LO phase.

6. The local oscillator (LO) circuit of claim 1, wherein the LO divider comprises a divide by 4 (DIV4) divider.

7. The local oscillator (LO) circuit of claim 1, wherein the decision logic is configured to generate a predicted LO phase based on a number of cycles of the VCO output signal (vco_g) and the programmable divider is adjusted based on the predicted phase.

8. The local oscillator (LO) circuit of claim 1, wherein the programmable divider is coupled in a feedback path of the PLL circuit.

9. A method for maintaining phase continuity of a local oscillator (LO), comprising:
    setting a predetermined initial phase of a local oscillator (LO) divider;
    generating a voltage controlled oscillator (VCO) signal (vco_g) using a clock gating circuit after a period of VCO inactivity;
    determining whether the VCO signal (vco_g) is aligned with a continuous phase signal; and
    when the VCO signal (vco_g) is not aligned with the continuous phase signal, aligning the VCO signal (vco_g) with the continuous phase signal.

10. The method of claim 9, wherein the predetermined initial phase of the LO divider is set after a period of local oscillator inactivity and prior to generating the VCO signal (vco_g).

11. The method of claim 9, wherein the predetermined initial phase of the LO divider is selected from 0 degrees and 180 degrees.

12. The method of claim 9, further comprising:
    determining a predicted LO phase;

comparing the predicted LO phase with an actual LO phase; and
when the predicted LO phase differs from the actual LO phase, adjusting a divider control signal so that the predicted LO phase is the same as the actual LO phase.

13. The method of claim 9, wherein the LO divider comprises a divide by 2 (DIV2) divider.

14. The method of claim 9, wherein the LO divider comprises a divide by 4 (DIV4) divider.

15. The method of claim 9, further comprising coupling the VCO signal (vco_g) to the LO divider and to phase determination circuitry only after the VCO has settled.

16. A device, comprising:
means for setting a predetermined initial phase of a local oscillator (LO) divider;
means for generating a voltage controlled oscillator (VCO) signal (vco_g) after a period of VCO inactivity;
means for determining whether the VCO signal (vco_g) is aligned with a continuous phase signal; and
means for aligning the VCO signal (vco_g) with the continuous phase signal when the VCO signal (vco_g) is not aligned with the continuous phase signal.

17. The device of claim 16, wherein the means for setting the predetermined initial phase of the LO divider comprises setting the predetermined initial phase of the LO divider after a period of local oscillator inactivity and prior to generating the VCO signal (vco_g).

18. The device of claim 16, wherein the means for setting the predetermined initial phase of the LO divider comprises means for selecting from 0 degrees and 180 degrees.

19. The device of claim 16, further comprising:
means for determining a predicted LO phase;
means for comparing the predicted LO phase with an actual LO phase; and
when the predicted LO phase differs from the actual LO phase, means for adjusting a divider control signal so that the predicted LO phase is the same as the actual LO phase.

20. The device of claim 16, wherein the LO divider comprises a divide by 2 (DIV2) divider.

21. The device of claim 16, wherein the LO divider comprises a divide by 4 (DIV4) divider.

22. A local oscillator (LO) circuit, comprising:
a voltage controlled oscillator (VCO) and a clock gating circuit configured to generate a VCO output signal (vco_g);
a local oscillator (LO) divider configured to receive the VCO output signal (vco_g) and a local oscillator (LO) preset signal, the LO preset signal configured to set the LO divider to a predetermined initial phase, wherein the LO divider is an in-phase/quadrature (I/Q) divider and comprises a plurality of inverters and a plurality of switches coupled to the plurality of inverters, the plurality of switches configured to receive the LO preset signal, the LO preset signal configured to set the predetermined initial phase of the LO divider after a period of local oscillator inactivity and prior to activation of the VCO;
a programmable divider configured to receive a divider signal and the VCO output signal (vco_g) and generate a phase detection signal, the programmable divider disposed in a feedback path of a phase locked loop (PLL) circuit; and
an adjustment circuit configured to adjust a phase of the VCO output signal (vco_g).

23. The local oscillator (LO) circuit of claim 22, wherein the predetermined initial phase of the LO divider is selected from 0 degrees and 180 degrees.

24. The local oscillator (LO) circuit of claim 22, further comprising a data processor configured to compare a predicted VCO output signal phase with an actual VCO output signal phase.

25. The local oscillator (LO) circuit of claim 24, wherein the data processor is configured to adjust the divider signal so that the predicted VCO output signal phase matches the actual VCO output signal phase when the predicted VCO output signal phase differs from the actual VCO output signal phase.

* * * * *